US007135344B2

(12) United States Patent
Nehmadi et al.

(10) Patent No.: US 7,135,344 B2
(45) Date of Patent: Nov. 14, 2006

(54) DESIGN-BASED MONITORING

(75) Inventors: Youval Nehmadi, Modiin (IL);
Josephine Phua, San Jose, CA (US);
Jacob Joseph Orbon, Jr., Morgan Hill, CA (US); Ariel Ben-Porath, Gealya (IL); Evgeny Levin, Cupertino, CA (US); Ofer Bokobza, Cupertino, CA (US)

(73) Assignee: Applied Materials, Israel, Ltd., Rehovot (IL)

( * ) Notice: Subject to any disclaimer, the term of this patent is extended or adjusted under 35 U.S.C. 154(b) by 82 days.

(21) Appl. No.: 10/780,377

(22) Filed: Feb. 17, 2004

(65) Prior Publication Data
US 2005/0010890 A1 Jan. 13, 2005

Related U.S. Application Data

(60) Provisional application No. 60/486,565, filed on Jul. 11, 2003.

(51) Int. Cl.
*H01L 21/66* (2006.01)
(52) U.S. Cl. .............................. 438/14; 438/10; 438/17
(58) Field of Classification Search .................. 438/7, 438/10, 11, 12, 14, 16, 17; 716/4, 5, 19, 716/20, 21
See application file for complete search history.

(56) References Cited

U.S. PATENT DOCUMENTS

| 6,415,421 | B1 * | 7/2002 | Anderson et al. ............... 716/4 |
| 6,425,113 | B1 * | 7/2002 | Anderson et al. ............... 716/5 |
| 6,529,621 | B1 | 3/2003 | Alles et al. |
| 2003/0229881 | A1 * | 12/2003 | White et al. ................... 716/19 |
| 2005/0004774 | A1 * | 1/2005 | Volk et al. ................... 702/108 |

OTHER PUBLICATIONS

Applied Materials Israel, Ltd., International Search Report and Written Opinion, PCT/US2004/02229, Oct. 14, 2004, 9 pp.
Sebasta W W et al, Development of a New Standard for Test, Sep. 10, 1999, Proceedings of the International Test Conference, Washington, pp. 988-993.

\* cited by examiner

*Primary Examiner*—Kevin M. Picardat
(74) *Attorney, Agent, or Firm*—Tarek N. Fahmi

(57) ABSTRACT

A method for monitoring fabrication of an integrated circuit (IC) on a semiconductor wafer includes generating a product design profile (PDP) using an electronic design automation (EDA) tool, the PDP comprising an indication of a site in at least one layer of the IC that is susceptible to a process fault. Upon fabricating at least one layer of the IC on the wafer, a process monitoring tool is applied to perform a measurement at the site in at least one layer responsively to the PDP.

25 Claims, 6 Drawing Sheets

DESIGN-BASED MONITORING

CROSS-REFERENCE TO RELATED APPLICATION

This application claims the benefit of U.S. Provisional Patent Application 60/486,565, filed Jul. 11, 2003, which is incorporated herein by reference.

FIELD OF THE INVENTION

The present invention relates generally to process monitoring, and specifically to methods and apparatus for inspection and testing of semiconductor wafers and reticles in production.

BACKGROUND OF THE INVENTION

Electronic design automation (EDA) tools are applied extensively in the design of integrated circuits and in verification of these designs. EDA tools are used, for example, in logic synthesis, placement and routing of circuit elements, circuit layout and design rule checking. At the end of the design process, a set of reticles (also referred to as masks or templates) is generated for use in producing the integrated circuit (IC). Each reticle corresponds to one layer of the thin film structures that will be fabricated on a semiconductor wafer to produce the IC.

In the fabrication facility (fab), the reticles are used to print the successive circuit layers on the wafer in a photolithographic process. Each wafer undergoes hundreds of processing steps, including not only printing the reticles, but also material deposition, etching, cleaning and polishing. Defects in any of the process steps can substantially reduce the process yield. Therefore, monitoring tools are used to check wafers at nearly every step in the process to verify that the processing tools are functioning properly. Monitoring tools that are used for this purpose include systems for inspection and metrology of integrated circuit structures (typically optical or electron beam-based), as well as systems for electrical testing of circuit components. Reticles are also monitored for defects that may result in defects on the wafer. In the context of the present patent application and in the claims, the term "monitoring" should be understood as including all available modalities for testing wafers and reticles in production for purposes of detecting process or product defects. Monitoring modalities include, but are not limited to, measurement of critical dimensions (CD), film thickness and film composition; defect inspection, review and classification; electrical testing, including in-line and end-of-line tests; profilometry; ellipsometry; reflectometry; particle monitoring; and integrated defect detection and removal, using systems such as the Applied Materials "Bee."

U.S. Pat. No. 6,529,621, whose disclosure is incorporated herein by reference, describes mechanisms for making and inspecting reticles, based on a reusable circuit design for use with EDA tools. The patent points out that conventional inspection systems waste valuable resources by inspecting some regions of the reticle too stringently, and not reliably inspecting other regions stringently enough. Conventional inspection systems and techniques are unable to distinguish between critical and non-critical areas of the reticle. The patent therefore describes mechanisms for flagging critical or noncritical regions of an IC pattern database. Other design flow procedures, such as reticle production and inspection and IC device fabrication, may then be based on the flagged critical or noncritical areas in the database.

SUMMARY OF THE INVENTION

Process engineers in the semiconductor fab are faced with conflicting needs: Although process monitoring should be as thorough as possible to provide early detection of all process defects, testing in practice must often be limited to a small number of locations on the wafer so as not to compromise the process throughput. In general, the process engineer selects the locations to test based on ad hoc recipes. Given the extreme complexity of modern IC designs and production processes, it is almost inevitable that this heuristic approach will fail to select the optimal set of locations for testing.

In response to this difficulty, the present invention provides methods and systems for applying design information generated by EDA tools in process monitoring. In embodiments of the present invention, EDA tools are used to assemble a product diagnostic profile (PDP) during the design of an IC. For each IC die, and each reticle in the set used to produce the die (i.e., for each circuit layer to be fabricated on the wafer), the PDP contains various categories of data for use in guiding the associated process monitoring steps. Typically, the data include targets (used for wafer alignment in inspection tools), special test structures, classification of regions of the wafer based on geometrical and/or functional qualities, and identification of critical sites for measurement during production. Additionally or alternatively, other data types may be included in the PDP.

The PDP data are transferred to the fab for use by process engineers in defining the monitoring steps to be performed on each die at each stage in production. Typically (although not necessarily), the PDP data are transferred together with the design of the reticle set to which the data apply. When different dies are combined in a common reticle set (so that multiple different ICs are produced on the same wafer), the PDP data may likewise be combined for monitoring purposes. The PDP data assist the process engineer in determining the appropriate test types and recipes to be used at each production stage and in choosing the locations to test. Judicious use of the PDP data can maximize the sensitivity of detection of process deviations and enable early discovery of process faults, while minimizing the impact of testing on process throughput.

Although the embodiments described hereinbelow relate specifically to tests that are applied to IC patterns on semiconductor wafers, the principles of the present invention may similarly be applied to testing of the reticles that are used in production of the wafers, as well as to other microfabrication-based manufacturing processes, such as MEMS, FPDs and fine-line PCBs.

There is therefore provided, in accordance with an embodiment of the present invention, a method for monitoring fabrication of an integrated circuit (IC) on a semiconductor wafer, including:

generating a product design profile (PDP) using an electronic design automation (EDA) tool, the PDP including an indication of a site in at least one layer of the IC that is susceptible to a process fault;

fabricating at least one layer of the IC on the wafer; and applying a process monitoring tool to perform a measurement at the site in at least one layer responsively to the PDP.

In one embodiment, applying the process monitoring tool includes measuring a dimension associated with one or more features of the IC at the site.

In another embodiment, generating the PDP includes making a determination that the site is critical to a performance rating of the IC, and selecting the site responsively to the determination.

In yet another embodiment, generating the PDP includes making a determination that the site is marginal with respect to a design rule of the IC, and selecting the site responsively to the determination. Alternatively or additionally, generating the PDP includes making a determination that the site is marginal with respect to a variation in a parameter of a process used in fabricating the IC, and selecting the site responsively to the determination.

In still another embodiment, generating the PDP includes determining a mask error enhancement factor (MEEF) at the site, and selecting the site responsively to the MEEF. Alternatively or additionally, generating the PDP includes determining an optical proximity correction (OPC) to be applied at the site, and selecting the site responsively to the OPC.

In a further embodiment, generating the PDP includes determining a density of structures in the IC at the site, and selecting the site responsively to the density.

In one embodiment, the site includes a location of a pair of matched circuit elements, and applying the process monitoring tool includes verifying that a critical characteristic of both the circuit elements in the pair is substantially identical.

In another embodiment, the method includes predicting a yield of the fabrication of the IC responsively to the PDP and to the measurement.

There is also provided, in accordance with an embodiment of the present invention, a method for monitoring fabrication of an integrated circuit (IC) on a semiconductor wafer, including:

generating a product design profile (PDP) using an electronic design automation (EDA) tool, the PDP including an identification of a region in at least one layer of the IC that is characterized by a periodic pattern;

fabricating at least one layer of the IC on the wafer; and applying a process monitoring tool to perform a measurement in the region of at least one layer responsively to the periodic pattern.

In some embodiments, generating the PDP includes determining a pitch and a direction of the periodic pattern, and applying the process monitoring tool includes selecting a spatial filter responsively to the pitch and the direction, and performing optical inspection of the region using the spatial filter.

In another embodiment, generating the PDP includes determining a direction of the periodic pattern, and applying the process monitoring tool includes selecting a scan direction responsively to the direction of the periodic pattern, and inspecting the region while scanning over the region in the selected scan direction.

In yet another embodiment, generating the PDP includes determining an exact period of a repetitive feature in the periodic pattern, and applying the process monitoring tool includes capturing multiple images of the feature at locations on the wafer that are mutually spaced by the exact period, and comparing each of the images to another of the images or to a reference image.

In a further embodiment, applying the process monitoring tool includes determining, responsively to the periodic pattern, a sensitivity setting to be applied by the process monitoring tool in detecting defects in the region, wherein different sensitivity settings are applied by the process monitoring tool in different regions of at least one layer.

There is additionally provided, in accordance with an embodiment of the present invention, a method for monitoring fabrication of an integrated circuit (IC) on a semiconductor wafer, including:

generating a product design profile (PDP) using an electronic design automation (EDA) tool, the PDP including an identification of a plurality of regions in at least one layer of the IC and a respective criticality parameter for each of the regions, indicative of a maximum tolerable defect size in each of the regions;

fabricating at least one layer of the IC on the wafer; and applying a process monitoring tool to perform a measurement in one or more of the regions in at least one layer responsively to the respective criticality parameter.

Typically, applying the process monitoring tool includes setting a defect detection threshold in each of the one or more of the regions responsively to the respective criticality parameter. Additionally or alternatively, applying the process monitoring tool includes selecting the one or more of the regions to inspect responsively to the respective criticality parameter. Further additionally or alternatively, applying the process monitoring tool includes detecting a defect in one of the regions, and classifying the defect responsively to the criticality parameter.

There is further provided, in accordance with an embodiment of the present invention, a method for monitoring fabrication of an integrated circuit (IC) on a semiconductor wafer, including:

designing a layout of at least one layer of the IC using an electronic design automation (EDA) tool, at least one layer including a structure that is amenable to testing;

generating a product design profile (PDP) using the EDA tool, the PDP including information regarding the structure;

fabricating at least one layer of the IC on the wafer; and applying a process monitoring tool to perform a measurement on the structure in at least one layer, responsively the information in the PDP.

Typically, the structure includes a dedicated test structure, wherein the dedicated test structure is located in a non-die area of the wafer.

In some embodiments, the structure includes multiple elongate parallel conductors, and applying the process monitoring tool includes testing an electrical continuity of the conductors. Typically, testing the electrical continuity includes applying an electrical charge at a first end of at least some of the conductors, and measuring the electrical charge at a second end of the conductors.

In another embodiment, the structure includes one or more contact openings in at least one layer, and applying the process monitoring tool includes directing an electron beam to irradiate the one or more contact openings, and measuring a specimen current responsively to the electron beam.

There is moreover provided, in accordance with an embodiment of the present invention, apparatus for producing an integrated circuit (IC) on a semiconductor wafer, including:

an electronic design automation (EDA) tool, which is adapted to generate a design of at least one layer of the IC and a product design profile (PDP), which includes an indication of a site in at least one layer that is susceptible to a process fault;

a production tool, which is adapted to fabricate at least one layer of the IC on the wafer responsively to the design; and a process monitoring tool, which is adapted to perform a measurement at the site in at least one layer responsively to the PDP.

In one embodiment, the apparatus includes a computer processor, which is adapted to predict a yield of the fabrication of the IC responsively to the PDP and to the measurement.

There is furthermore provided, in accordance with an embodiment of the present invention, apparatus for producing an integrated circuit (IC) on a semiconductor wafer, including:

an electronic design automation (EDA) tool, which is adapted to generate a design of at least one layer of the IC and a product design profile (PDP), which includes an identification of a region in the at least one layer of the IC that is characterized by a periodic pattern;

a production tool, which is adapted to fabricate at least one layer of the IC on the wafer responsively to the design; and a process monitoring tool, which is adapted to perform a measurement in the region in at least one layer responsively to the periodic pattern.

There is also provided, in accordance with an embodiment of the present invention, apparatus for producing an integrated circuit (IC) on a semiconductor wafer, including:

an electronic design automation (EDA) tool, which is adapted to generate a design of at least one layer of the IC and a product design profile (PDP), which includes an identification of a plurality of regions in the at least one layer of the IC and a respective criticality parameter for each of the regions, indicative of a maximum tolerable defect size in each of the regions;

a production tool, which is adapted to fabricate at least one layer of the IC on the wafer responsively to the design; and a process monitoring tool, which is adapted to perform a measurement in one or more of the regions responsively to the respective criticality parameter.

There is additionally provided, in accordance with an embodiment of the present invention, apparatus for producing an integrated circuit (IC) on a semiconductor wafer, including:

an electronic design automation (EDA) tool, which is adapted to generate a design of at least one layer of the IC, the layout including a structure that is amenable to testing, and which is further adapted to generate and a product design profile (PDP), which includes information regarding the structure;

a production tool, which is adapted to fabricate at least one layer of the IC on the wafer responsively to the design; and a process monitoring tool, which is adapted to perform a measurement on the structure, responsively the information in the PDP.

There is further provided, in accordance with an embodiment of the present invention, a computer software product for use in producing an integrated circuit (IC) on a semiconductor wafer, the product including a computer-readable medium in which program instructions are stored, the instructions including at least one of an electronic design automation (EDA) program component and a process monitoring program component, wherein the EDA program component, when read by a computerized EDA tool, causes the EDA tool to generate a design of at least one layer of the IC and a product design profile (PDP), which includes an indication of a site in at least one layer that is susceptible to a process fault, and wherein the process monitoring program component, when read by a computerized process monitoring tool after fabrication of at least one layer of the IC on the wafer responsively to the design, causes the process monitoring tool to perform a measurement at the site in at least one layer responsively to the PDP.

There is moreover provided, in accordance with an embodiment of the present invention, a computer software product for use in producing an integrated circuit (IC) on a semiconductor wafer, the product including a computer-readable medium in which program instructions are stored, the instructions including at least one of an electronic design automation (EDA) program component and a process monitoring program component, wherein the EDA program component, when read by a computerized EDA tool, causes the EDA tool to generate a design of at least one layer of the IC and a product design profile (PDP), which includes an identification of a region in the at least one layer of the IC that is characterized by a periodic pattern, and wherein the process monitoring program component, when read by a computerized process monitoring tool after fabrication of at least one layer of the IC on the wafer responsively to the design, causes the process monitoring tool to perform a measurement in the region in at least one layer responsively to the periodic pattern.

There is furthermore provided, in accordance with an embodiment of the present invention, a computer software product for use in producing an integrated circuit (IC) on a semiconductor wafer, the product including a computer-readable medium in which program instructions are stored, the instructions including at least one of an electronic design automation (EDA) program component and a process monitoring program component, wherein the EDA program component, when read by a computerized EDA tool, causes the EDA tool to generate a design of at least one layer of the IC and a product design profile (PDP), which includes an identification of a plurality of regions in the at least one layer of the IC and a respective criticality parameter for each of the regions, indicative of a maximum tolerable defect size in each of the regions, and wherein the process monitoring program component, when read by a computerized process monitoring tool after fabrication of at least one layer of the IC on the wafer responsively to the design, causes the process monitoring tool to perform a measurement in one or more of the regions responsively to the respective criticality parameter.

There is also provided, in accordance with an embodiment of the present invention, a computer software product for use in producing an integrated circuit (IC) on a semiconductor wafer, the product including a computer-readable medium in which program instructions are stored, the instructions including at least one of an electronic design automation (EDA) program component and a process monitoring program component, wherein the EDA program component, when read by a computerized EDA tool, causes the EDA tool to generate a design of at least one layer of the IC, the layout including a structure that is amenable to testing, and a product design profile (PDP), which includes information regarding the structure, and wherein the process monitoring program component, when read by a computerized process monitoring tool after fabrication of at least one layer of the IC on the wafer responsively to the design, causes the process monitoring tool to perform a measurement on the structure, responsively the information in the PDP.

There is additionally provided, in accordance with an embodiment of the present invention, apparatus for monitoring production of an integrated circuit (IC) on a semiconductor wafer, following fabrication of at least one layer of the IC on the wafer responsively to a design and a product design profile (PDP) generated by an electronic design automation (EDA) tool, the PDP including an indication of a site in at least one layer that is susceptible to a process fault, the apparatus including:

a process monitoring tool, which is adapted to perform a measurement at the site in at least one layer responsively to the PDP.

The present invention will be more fully understood from the following detailed description of the embodiments thereof, taken together with the drawings in which:

DETAILED DESCRIPTION OF EMBODIMENTS

System Overview

Figure 1:
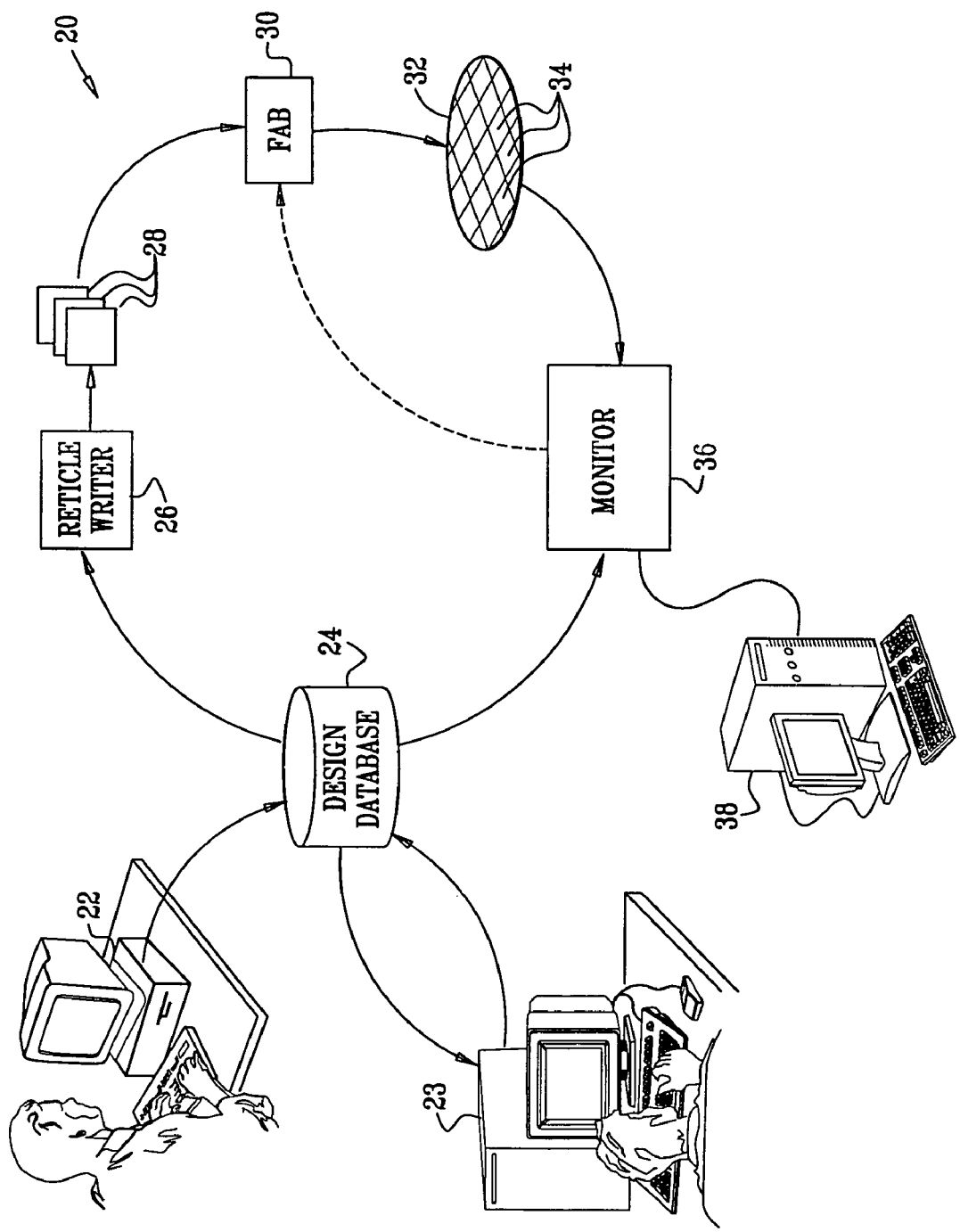
FIG. 1 is a schematic, pictorial illustration of a system for IC design and fabrication, in accordance with an embodiment of the present invention.

FIG. 1 is a schematic, pictorial illustration of a system 20 for IC design and fabrication, in accordance with an embodiment of the present invention. A design engineer, using EDA tools on a design workstation 22, designs elements of the IC, from the logic synthesis down to the specific layout of circuit components. The design is stored in electronic form in a design database 24. The database specifies the set of reticles that are to be used in producing the IC. In addition, workstation 22 generates, as a by-product of the IC design, a product diagnostic profile (PDP), which is also held in the design database. The PDP, which is described in detail hereinbelow, is typically generated interactively by the design engineer on workstation 22. Alternatively or additionally, elements of the PDP may be generated by the workstation automatically. Further alternatively or additionally, a separate computer (not shown) may be used to generate all or part of the PDP based on the information in database 24.

A verification engineer checks the design in database 24 using a verification workstation 23. Such verification typically includes, for example, design rule checking, as well as other means known in the art for physical and functional design verification. Workstation 23 may also add data to the PDP, automatically or through interaction with the verification engineer.

Table I below shows a typical EDA work flow, from initial circuit specification through to tape-out. The flow steps are shown here by way of example, as background for creation of the PDP, which is described below. Those skilled in the art will recognize that there may be many variations and additions to the sequence of steps listed below, and that accordingly there may be variations, as well, in the methods used to derive the PDP data from different EDA tools.

TABLE I

EDA FLOW STEPS

| Step | Function |
|---|---|
| Behavioral modeling | Check functional aspects of design |
| Simulation | Check for design accuracy and faults |
| Logic synthesis | Create net list |
| Timing analysis | Check critical path and speed requirements |
| Place and route | Automated circuit layout |
| Layout | Manual changes to the circuit layout |
| RC extraction | Check parasitic capacitance and resistance in the circuit |
| Layout vs. schematic | Compare layout to net list design |
| Design rule check | Verify compliance with design rules |
| Stream GDS2 | Store design data in a geometrical polygon-based architecture |
| OPC | Optical proximity corrections - to accommodate optical artifacts in photolithography |
| Tape-out | Complete mask design |

When the design is complete, it is transferred to the fab for production. A reticle writer 26 generates a set of reticles 28 based on the design in database 24. The reticles are then used in a set of fab process tools, represented in the figure by a tool 30, to produce IC dies 34 on a silicon wafer 32. Of course, this view is grossly oversimplified, and multiple different process steps are typically applied to each layer on the wafer. In other words, each reticle 28 maps to a sequence of several process steps in the fab.

After each process step, wafer 32 may be inspected or otherwise tested by a monitoring tool 36. Typically, various different monitoring tools are used at different steps in the process. For example, a scanning electron microscope (SEM), such as the SEMVision™ or NanoSEM™ system, produced by Applied Materials (Santa Clara, Calif.), may be used for defect review and/or critical dimension measurements. As another example, an optical inspection system, such as the Compass™ or ComPLUS™ system, also produced by Applied Materials, may be used for bright-field or dark-field defect inspection. Alternatively, other types of inspection tools may be used, as may electronic test instruments, as are known in the art. Some particular test applications are described below in greater detail.

The specific types of tests to be performed by monitoring tool 36, and the locations on dies 34 at which the tests are to be applied, are selected based on data from the PDP in design database 24. Typically, a process engineer uses a monitoring workstation 38 to select and set up the tests interactively, based on the PDP data. The test results may be reviewed on workstation 38. When a defect or other process deviation is observed by monitoring tool 36, the results are used in making adjustments to process tool 30 in order to correct and avoid defects in subsequent wafers. The results may also be used for proactive monitoring—to refine the test procedure so as to focus on sites and regions that are known to be susceptible to defects.

Workstations 22, 23 and 38 typically comprise general-purpose computers, running suitable software for the purposes described hereinbelow. Monitoring tool 36 typically comprises a computer processor, as well, with suitable software for carrying out testing and inspection functions based on the PDP data in the design database. Thus, software for the purposes of the present invention typically comprises an EDA program component, for use on workstations 22 and/or 23, and a process monitoring program component, for use on workstation 38 and/or monitoring tool 36. The software for the workstations and the monitoring tool may be provided in electronic form, over a network, for example, or it may alternatively be supplied on tangible media, such as CD-ROM.

Data Structures

Figure 2:
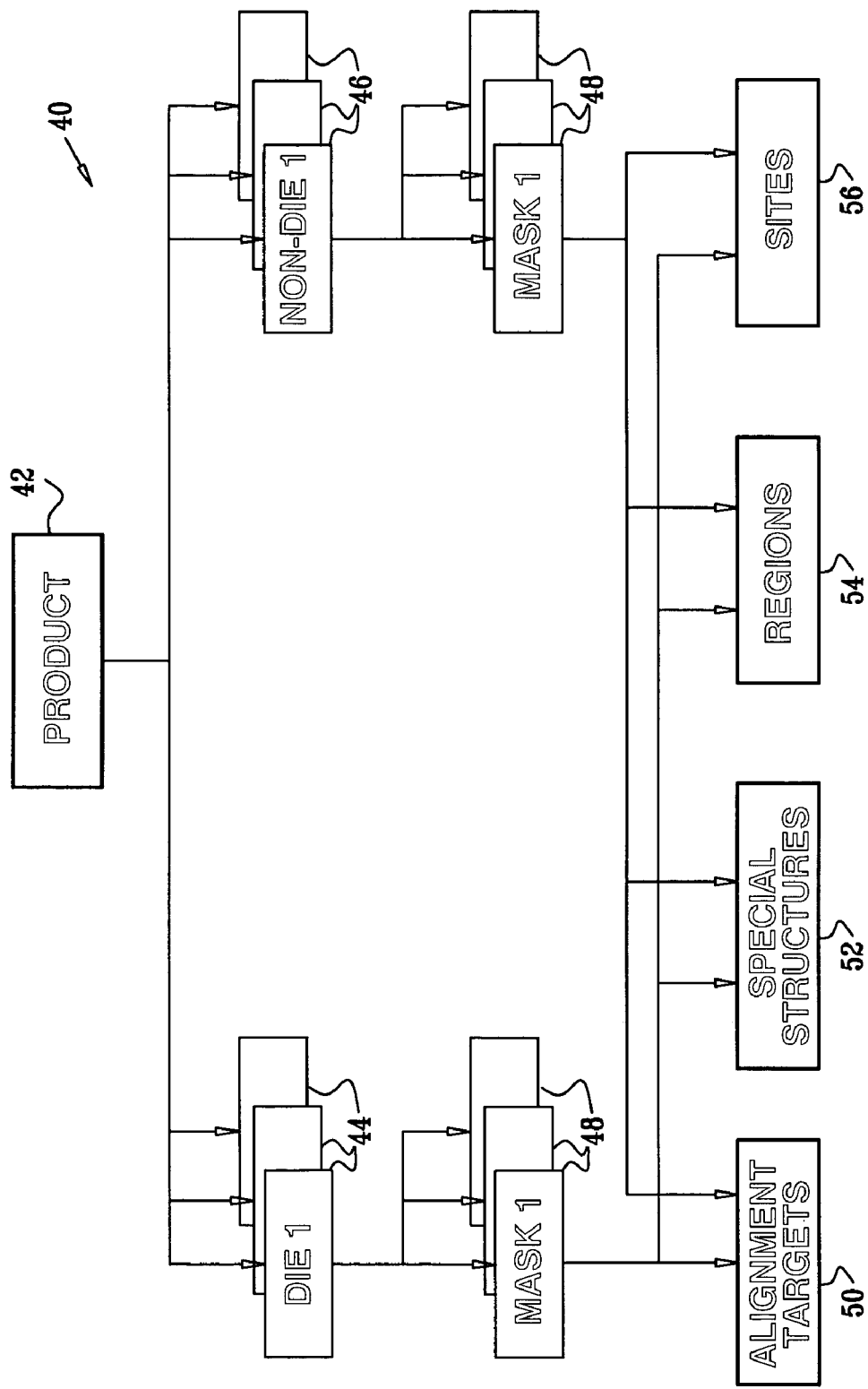
FIGS. 2 and 3 are block diagrams that schematically illustrate data structures in a product diagnostic profile, in accordance with an embodiment of the present invention.

FIG. 2 is a block diagram that schematically illustrates a data structure 40 that is used to hold PDP data, in accordance with an embodiment of the present invention. As noted above, the data in structure 40 are typically produced by a combination of automated and interactive steps in various stages of IC design and verification. Preferably, the data in structure 40 are written in a unified, predefined format, to allow the data to be exchanged between different design, verification and monitoring tools without additional translation steps. For example, the data format may be based on XML tags.

Structure 40 relates to a "product" 42, which corresponds to a set of reticles 28 that are used in the fab. The reticles may themselves include multiple dies, which may be multiple instances of the same IC or may belong to different ICs. Data structure 40, however, will generally contain multiple die records 44 only if a single reticle set is used to produce multiple different ICs. The data structure for each die 44 encapsulates the diagnostic information relating to the particular IC to which the die belongs. In addition, reticles typically comprise non-die areas 46 (scribe lines) in between dies 44. These non-die areas may contain features used for testing and alignment of the wafer. Information regarding these features is held in data structure 40 along with the die information.

For each die 44 (and each non-die area 46), structure 40 contains a set of masks 48, each corresponding to one of the reticles that are used in producing the die. Each mask 48 thus corresponds to a single photolithographic patterning step. As noted above, there may be multiple process steps associated with each mask. For each mask 48, the following categories of diagnostic data are provided:

Alignment targets 50—These are structures that are used for precise alignment of wafers in monitoring tools (as well as other process tools, such as steppers and scanners).

Special structures 52—These structures are typically (although not necessarily) placed in non-die areas, for use in specific testing functions related to the manufacturing process. Examples of special structures include structures that can be accessed for external probing, using electrical probes or suitable probes of other types. Other special structures include focus-exposure matrices and test structures for characterization of chemical-mechanical polishing (CMP) steps and optical proximity corrections (OPC).

Regions 54—These are relatively large areas, typically within die 44, that share some geometrical or functional quality that can be used by monitoring tools to optimize productivity, sensitivity, throughput or quality of the information that is generated in a given testing step. Details of region information are shown below in FIG. 3.

Sites 56—These are specific locations, typically expressed in X-Y coordinates, that have particular diagnostic significance. These sites and the measurements or other requirements pertaining to the sites may be specified explicitly by the IC design and verification engineers during the design of the IC reticle set. Alternatively or additionally, such sites may be identified automatically by EDA tools. Typically, sites 56 are chosen based on requirements relating to circuit functions and/or manufacturability. The listing of sites enables designers to specify critical locations for measurement and acceptable measurement tolerances at the locations.

The above categories are listed by way of example, and other categories may be added to structure 40.

Figure 3:
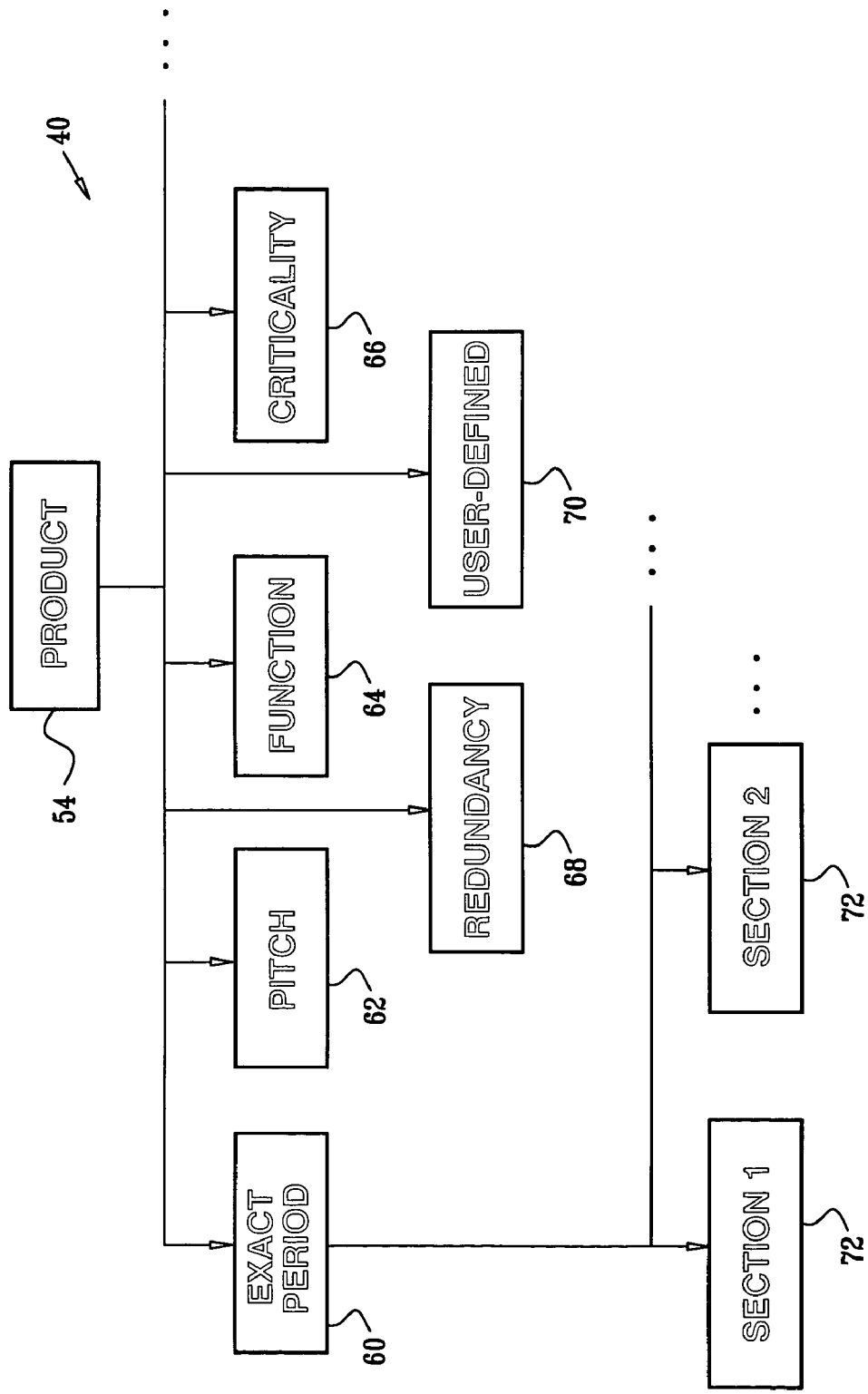

FIG. 3 is a block diagram that schematically shows details of the data structure used to hold information regarding regions 54 in the PDP, in accordance with an embodiment of the present invention. The regions of a given mask 48 may be segmented according to various different segmentation schemes, each based on a different classification parameter. Each segmentation scheme divides the reticle area into sections 72, depending on the classification parameter that is chosen. A given location on a particular die may thus belong to multiple different sections in different segmentation schemes.

The following exemplary segmentation schemes are shown in the figure:

Exact period 60—In an exact period section of the die, all structures are repetitive with the same spatial period. If high-resolution images (such as SEM images) of the section are taken at locations that are spaced by multiples of the period, the images should match exactly when overlaid one on another. In other words, a single patch of the region can be used as a reference for comparison of any other patch. Memory cells are a notable example of exact period structures. Typically, exact period segmentation is most useful in sections whose period ranges between 25 and 40 μm.

Pitch 62—Pitch sections are defined by a characteristic period in their spatial structure, although the structure is not necessarily repetitive. Pitch can be particularly important, for example, in determining optimal optical inspection parameters, as described hereinbelow.

Function 64—These sections are defined by their functionality, as defined by the die "floor plan." By way of example, functional sections may typically include:
SRAM array
DRAM array
Flash memory array
Column decoder
Row decoder
Redundancy circuit
Logic
JTAG (Joint Test Action Group)
Line drivers
Parallel bus
Analog amplifier
RF amplifier
User-defined sections Criticality 66—Segmentation by criticality depends on the sensitivity of different sections of the die to defects. The criticality classification of a section may depend, for example, on the maximum tolerable defect size in the section.

Redundancy 68—Certain regions of the die, such as memory arrays, have built-in redundancy, so that a certain number of defects can be tolerated without negative impact on the circuit. Other regions, such as decoder logic, may not include redundant elements. Redundancy sections may be classified by a redundancy parameter N, indicating the number of defective features that may be present in the section without causing die failure.

User-defined segmentation 70—Additional segmentation schemes may be defined by design, verification or process engineers.

The above segmentation schemes are listed here by way of example, and further schemes may be added to regions 54.

Figure 4:
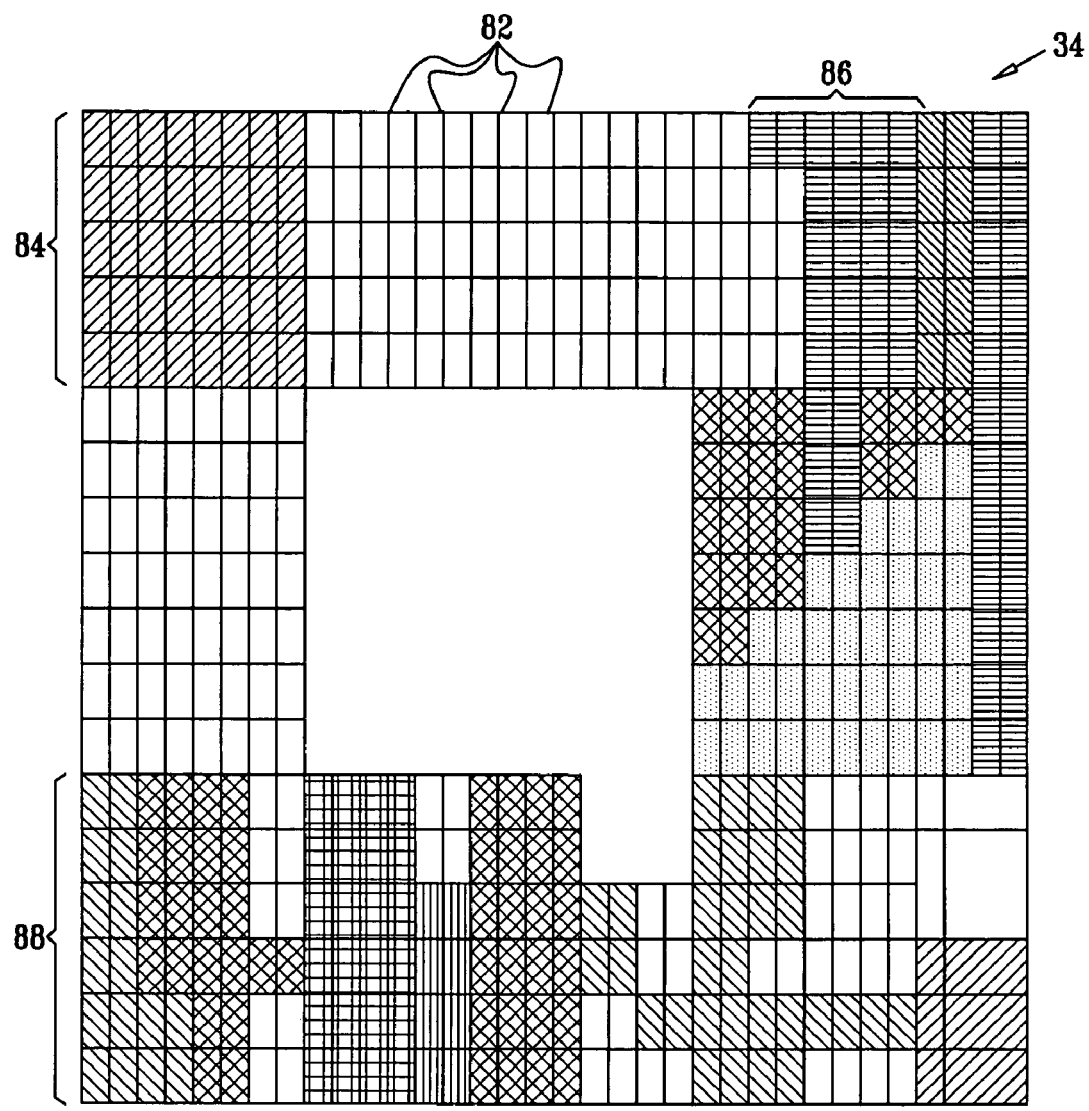
FIG. 4 is a schematic top view of a die in a semiconductor wafer showing division of the die into regions for monitoring purposes, in accordance with an embodiment of the present invention.

FIG. 4 is a schematic top view of one of dies 34, showing segmentation of the die into regions, in accordance with an embodiment of the present invention. Typically, die 34 comprises multiple cells 82, some occurring in repetitive patterns. The cells are hatched in the figure to show different sections of the die, based on various segmentation criteria. For example, a region 84 of the die may comprise memory, and thus may be classified by function. Another region 86 (which may overlap with region 84) may have a certain exact period, and may thus be classified as an exact period section. Yet another region 88 may comprise logic or analog circuits. The locations that are chosen for testing and the applicable test parameters at each stage in the production of die 34 are chosen based on the region segmentation of the mask that is used at that stage. Certain regions may have a higher concentration of test locations, while other regions may have fewer or no locations examined in a given test.

In the data structure for sites 56 (FIG. 2), each site record holds a list of one or more coordinate locations within the corresponding mask 48, along with a set of monitoring attributes that apply to all of these locations. The site record may also include a reference image of the site, for comparison against images of the site on the actual die. Other fields that may be contained in the site record—as provided by the design or verification engineer for use by the process engineer—include the following:

Device type (of the device at the site location), for example:
  Gate
  Conductor
  User-defined type.
Monitor type—the monitoring method that should be applied to the device, for example:
  Process inspection
  Width measurement
  Diameter measurement
  Minimum distance measurement between devices
  Maximum distance measurement between devices
  Three-dimensional profile measurement
  Matched width measurement.
Monitoring spec—the required measurement specification, such as the minimum and/or maximum permissible value, or the maximum deviation allowed among different measurements.
Measurement spec—other measurement parameters, including the required measurement direction and user comments.
Monitoring motivation—provided by the design or verification engineer to indicate the reason for monitoring this particular site, which may include:
  Critical timing point in a circuit.
  Critical alignment point (such as self-aligned contacts between different circuit layers).
  Matched transistors (which must have precisely-controlled characteristics for proper circuit performance—typically the transistors must be substantially identical, or have characteristics that are complementary or in a predefined ratio).
  Matched resistors (like matched transistors).
  Marginal to design rule—a site at which small process deviations may lead to design rule violation at this site.
  Dense layout—which may cause artifacts in photolithography, etching or other processes.
  Isolated feature (i.e., a feature needed for isolation between conductors).
  OPC issue—when OPC is used to print structures with sub-wavelength resolution, results may be unpredictable and should be tested.
  High mask error enhancement factor (MEEF)—may cause "amplification" of errors in printing the reticle on the die.
  Process dishing and erosion—problems that may occur in the CMP process because of different structure densities in different regions. Sparse regions may be more intensively eroded during the CMP process, and will therefore be lower than the rest of the die.
  Process step coverage.
  User-defined (other motivations not listed above).

These fields in the site data are listed here by way of example, and the site records may include other field types, as well.

The PDP data described above may be generated in multiple stages of the design process. Referring to the work flow shown above in Table I, for example, the following design steps are particularly useful in providing PDP data:

Layout vs. schematic—Identify sites and regions requiring inspection.
Design rule check (DRC)—Identify sites and regions containing marginal structures, i.e., structures that are close to the design rule limits. (Exemplary methods for DRC-based site selection are described below.) This step can also be used to determine overlay sites, such as self-aligning contacts and alignment targets, and sites for test structures, in addition to or instead of designating these sites in earlier design stages.
Stream GDS2—Determine periodicity and density of different regions, as well as the floor plan and size of the die and locations of alignment targets.
OPC—Extract sites for OPC verification. PDP data may be generated at other steps, as well.

IMPLEMENTATION EXAMPLES

The following section lists a number of exemplary applications of the use of PDP data generated by EDA workstations 22 and 23 (FIG. 1) in driving process monitor 36. These applications may advantageously use the data structures defined above. Alternatively, the relevant PDP data may be conveyed from the EDA tools or database to the appropriate process monitoring tools in other forms and formats.

Selection of Inspection and Measurement Locations

The PDP data may be used in selecting the locations on die 34 that are to be examined in a given monitoring step. This feature of the present invention is useful, for example, in automatic process inspection using e-beam and optical inspection tools, in critical dimension (CD) measurements and in other process monitoring applications. Typically, the locations for monitoring are those that are most susceptible to process faults, and are selected based on sites 56 that have been designated in the design and verification stages. As a result of this guided site selection, the monitoring sensitivity in critical areas of the die is improved. By-products of this approach may include reduced set-up time in developing monitoring recipes in the fab and improved utilization of existing monitoring tools. In addition, when the measurement sites are pre-selected by the designer, it may be possible to apply tighter control limits to the dimensions and to other circuit characteristics that are measured, thus increasing process yield.

Site-specific measurements can also be useful in providing feedback to the designers on the manufacturability of their designs.

As noted above, design rule checking in the EDA stage may be used in choosing sites to inspect in the fab. For example, a designer may run the layout of a given IC layer through a design rule checker (DRC) program, which marks the locations in the layout that violate the design rules provided by the fab where the IC is to be produced. The designer may then widen or narrow dimensions of certain objects in the X-direction, Y-direction, or both, and may then apply the DRC again (with the same design rules). Any new locations that are found to violate the design rules may be chosen as sites to list in the PDP. The steps of widening or narrowing dimensions and adding new sites may be repeated one or more times. Similarly, the threshold of the DRC for recording a violation of the design rules may be decreased in order to add sites to the PDP. If desired, the number of sites to be checked may be set in advance, and the DRC threshold may then be adjusted automatically in order to give the appropriate, preset number of sites.

An optical and process rule checking tool, such as the Calibre® ORC™ tool made by Mentor Graphics (Wilsonville, Oreg.) may be used in a similar fashion to identify sites for inspection. This tool simulates the production processes in the fab in order to verify that design structures will be properly printed on the wafer. Like the DRC described above, the ORC tool may be used to place inspection sites at locations at which violations are detected upon widening or narrowing dimensions in the design. Alternatively or additionally, the designer may increase or decrease other variable process parameters used in the ORC simulation in order to choose the inspection sites. For example, the designer may change the focus exposure setting of the ORC simulation, and may then place inspection sites at locations at which violations occur at the different settings. This latter method is useful in identifying sites that are sensitive to excursions of the process window. Other lithography and etch parameters used in the simulation may likewise be varied for this purpose.

Figure 5:
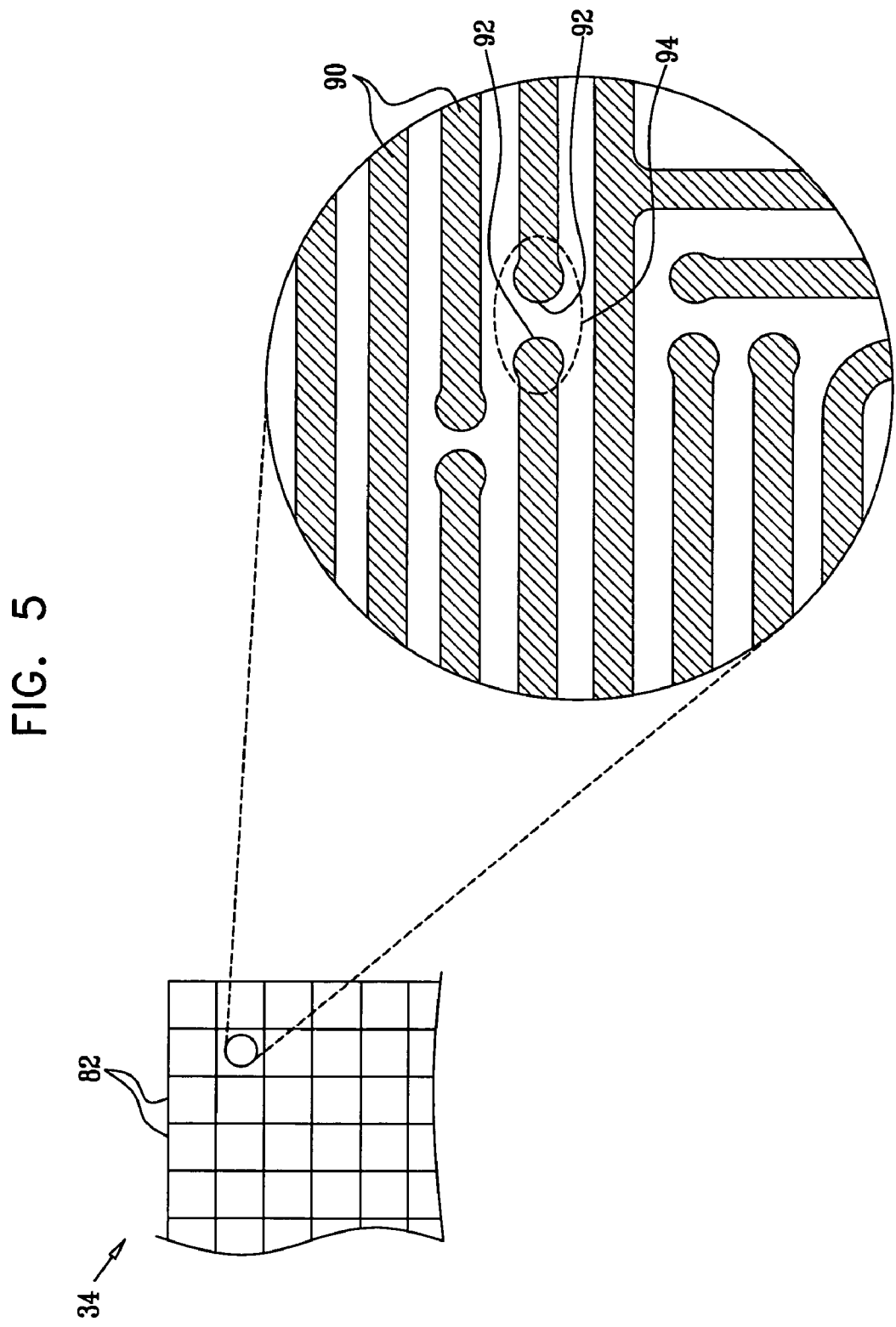
FIG. 5 is a schematic detail view showing structures formed on a semiconductor wafer and a test site associated with the structures, in accordance with an embodiment of the present invention.

FIG. 5 is a schematic detail view showing conductors 90 formed on die 34, illustrating another application of site-specific monitoring, in accordance with an embodiment of the present invention. CD measurements known in the art generally examine the widths of the conductors and the spacing between them. In the present example, however, it has been determined that the shapes and spacing of non-contacting ends 92 of adjacent conductors are particularly susceptible to systematic process problems, even when the critical dimensions along the lengths of the conductors are satisfactory. Therefore, the designer indicates one or more sites 94 in the design of the appropriate reticle at which such non-contacting ends occur. In production of the wafer, the spacing and other characteristics of ends 92 may be measured against the monitoring spec for site 94, and the production processes associated with the reticle in question may be adjusted accordingly, if necessary.

Sites that are critical to chip functionality, reliability or performance may be monitored in similar fashion. These are typically sites at which a small process distortion is likeliest to cause a device failure. These sites may be identified in early stages of the design workflow, such as the stages of circuit synthesis, simulation and timing analysis. For example, sites that affect the clock rating of the chip and sites of other critical-path driver transistors (on clock lines and buses) may be designated for monitoring. Other sorts of critical areas are described by Levasseur et al., in "Application of a Yield Model Merging Critical Areas and Defectivity Data to Industrial Products," Proceedings of the IEEE International Symposium on Defect and Fault Tolerance in VLSI Systems (1997), pages 11–19, which is incorporated herein by reference.

As another example, which was mentioned above, the designer may indicate the sites of pairs of matched transistors for measurement of critical characteristics, such as the oxide area. Transistor matching can be particularly crucial in the yield of analog circuits, such as operational amplifiers and push-pull amplifier stages. The critical characteristics of the paired elements must be substantially identical, to within a prescribed tolerance. The importance of transistor matching is described further by Pelgrom et al., in "Transistor Matching in Analog CMOS Applications," IEEE International Electron Devices Meeting (IEDM 98, 1998), pages 915–918, which is incorporated herein by reference.

Sites may further be selected based on the other "monitoring motivations" listed in the preceding section, including sites of the following types:

Non-redundant areas and devices, particularly in memory chips.

Extremely dense or extremely isolated features.

Critical alignment structures, such as self-aligned contacts.

Locations of high MEEF.

OPC locations.

Regions within the design of an IC that have relatively low aerial-image contrast are typically characterized by high MEEF, i.e., large amplification of reticle errors. Inspection of high-MEEF sites can therefore be useful in detecting reticle errors and preventing yield loss that may result from such errors. A method that can be used in this context for selecting measurement points with high MEEF values is described, for example, by Adrichem et al., in "Mask Error Enhancement-Factor (MEEF) Metrology Using Automated Scripts in CATS," Proceedings of the 22nd Annual BACUS Symposium on Photomask Technology (SPIE, Monterey, Calif., 2002), which is incorporated herein by reference.

As noted above, OPC is used in correcting for optical proximity effects that occur in printing structures of sub-wavelength dimensions on wafers. Simulations of sub-wavelength lithography that can be performed by EDA tools are not entirely accurate, and the results of OPC may vary depending on the shape of the structure and the background against which it is printed. To address this problem, sites may be selected for monitoring, based on the OPC stage of the design process, in order to provide representative samples of a range of different OPC conditions. For example, OPC sites with different structures may be chosen. Additionally or alternatively, it is possible to choose a group of OPC sites that have substantially the same structure, but are surrounded by different background structures, or are surrounded by structures of different densities (dense vs. sparse structures).

Use of Periodic Regions in Setting Monitoring Parameters

As noted above, regions of mask 48 are classified by pitch 62 (FIG. 3), which indicates not only the spacing of periodic patterns in the region, but also the direction of the lines that make up such patterns. For example, a periodic structure, based on horizontal lines, is shown in FIG. 5.

When a sample, such as a wafer or mask, is illuminated by coherent light in an optical inspection system, periodic patterns on the sample generate constructive interference lobes along well-defined directions. The position and extent of the interference lobes depend on the period and direction of the pattern. The interference lobes may be blocked using a suitable spatial (Fourier) filter, as is known in the art. Blocking out the interference lobes facilitates the detection of defects and pattern irregularities on the sample.

As illustrated above in FIGS. 3 and 4, the PDP data provided by EDA tools makes it possible to divide each die into regions according to pitch 62 and according to the direction of the pattern of the mask in the region. Based on this information, the spatial filter for each region may be precomputed, rather than chosen by trial and error. This application of the PDP data reduces the set-up time involved in optical inspection recipes and may improve the sensitivity of optical detection by allowing the optimal Fourier filter to be designed and used in each case.

The direction and the density of the pattern in each region of the mask also define the level of sensitivity that can be applied in inspection of the corresponding region of the wafer. The sensitivity is expressed, for example, in terms of inspection parameters such as the beam energy and spot size that can be used to irradiate the wafer for inspection, detector sensitivity settings and detection algorithm thresholds. When the same sensitivity is used over the entire wafer, as in systems known in the art, the least sensitive setting (determined by the "noisiest" region of the wafer) must be applied to the entire wafer. By separating the wafer into regions according to pattern direction and density, it is possible to increase the sensitivity in regions that do not contain a noisy pattern, and thus to detect more defects in these quiet regions without increasing the number of false alarms in the noisy regions.

The direction of the periodic pattern in a given region may be used to optimize monitoring procedures in other ways, as well. For example, in on-the-fly optical classification of defects, the directionality of the pattern may be used to enhance the accuracy of automatic defect classification. The classification is typically made according to the intensity of light received by detectors that are located around the wafer at different angles. The amount of light that reaches each detector depends not only on the defect itself, but also on the pattern direction in the region around the defect. The known pattern directions can thus be used to achieve higher accuracy in the classification algorithm. Furthermore, a defect may often be classified as "killer" or "non-killer" depending on the region in which the defect was found.

The scan direction (horizontal or vertical) of the inspection head relative to the wafer in each region can also be selected automatically according to the pattern direction. Generally, it is desirable to scan parallel to the lines of the pattern, so that the Fourier filter can remain fixed during the scan, as well as to facilitate die-to-die registration for comparison purposes in both optical and SEM-based inspection.

Identification of Repeating Cells

PDP data regarding regions of exact period 60 may be used automatically or manually to identify the regions of the die that contain a matrix of identical cells. As noted above in reference to FIG. 3, these regions can be inspected by cell-to-cell or cell-to-reference comparison, typically using a defect review SEM. The use of cell-to-cell comparison (as opposed to die-to-die comparison) is useful in increasing the throughput of the SEM inspection system.

Die-to-Database Defect Detection

It is also possible to use the PDP data in order to compare images of dies on the wafer to the mask design, instead of using die-to-die comparison for defect detection, as in systems known in the art. In die-to-database detection using SEM images, for example, each SEM image is typically compared to the design by subtracting the edges in the design from the edges in the SEM image. This approach is useful in increasing inspection throughput, as well as in detecting defects that recur on multiple dies, and thus would not be detected by die-to-die comparison (for example, a particle on the mask that causes a deformation of the pattern on the wafer).

Automated Alignment

As shown in FIG. 2, the PDP data may include locations of alignment targets 50 for each mask 48. Monitoring tools may also receive the sizes and locations of dies 34 on wafer 32 either from design database 24 (FIG. 1), or from another source in the fab. Using this information, the exact locations of all relevant alignment targets on the wafer may be determined automatically for monitoring purposes, obviating the need for manual input of these parameters by the process engineer.

Setting Defect Detection Parameters

As noted above in reference to FIG. 3, the criticality classification of a region of the die is typically indicative of the maximum tolerable defect size in the region. Defects on the reticle or on the wafer that are larger than this maximum tolerable size are likely to connect separate circuit features adjacent to the defect. The criticality parameter in each section may thus be used to set the sensitivity threshold for defect detection in an optical inspection system or defect review SEM. In regions with high criticality, the threshold may be set low, in order to permit detection of very small particles. In regions with low criticality, it may be possible to forgo inspection entirely. Controlling the detection sensitivity in this manner permits throughput to be maximized—by avoiding unnecessary inspection of non-critical areas—while focusing detection resources where and as they are needed.

Additionally or alternatively, the criticality classification may be used in assigning a "killer index" to each defect, indicating the expected functional effect of the defect on the chip. The functional effect will generally depend not only on criticality, but also on other region classification factors, such as function and redundancy. These factors may also be used in selecting certain defects for further review, either by the inspection tool itself or by a process engineer, or both.

Region segmentation based on PDP data may also be used in automatic defect classification (ADC), so as to eliminate the manual segmentation procedure that is generally required in order to tune the ADC algorithm in defect review systems known in the art. For example, the region information may be used to automatically set variable gray-level thresholds that are used to detect and classify defects in different regions of the wafer.

Selecting Test Structures and Procedures

Figure 6:
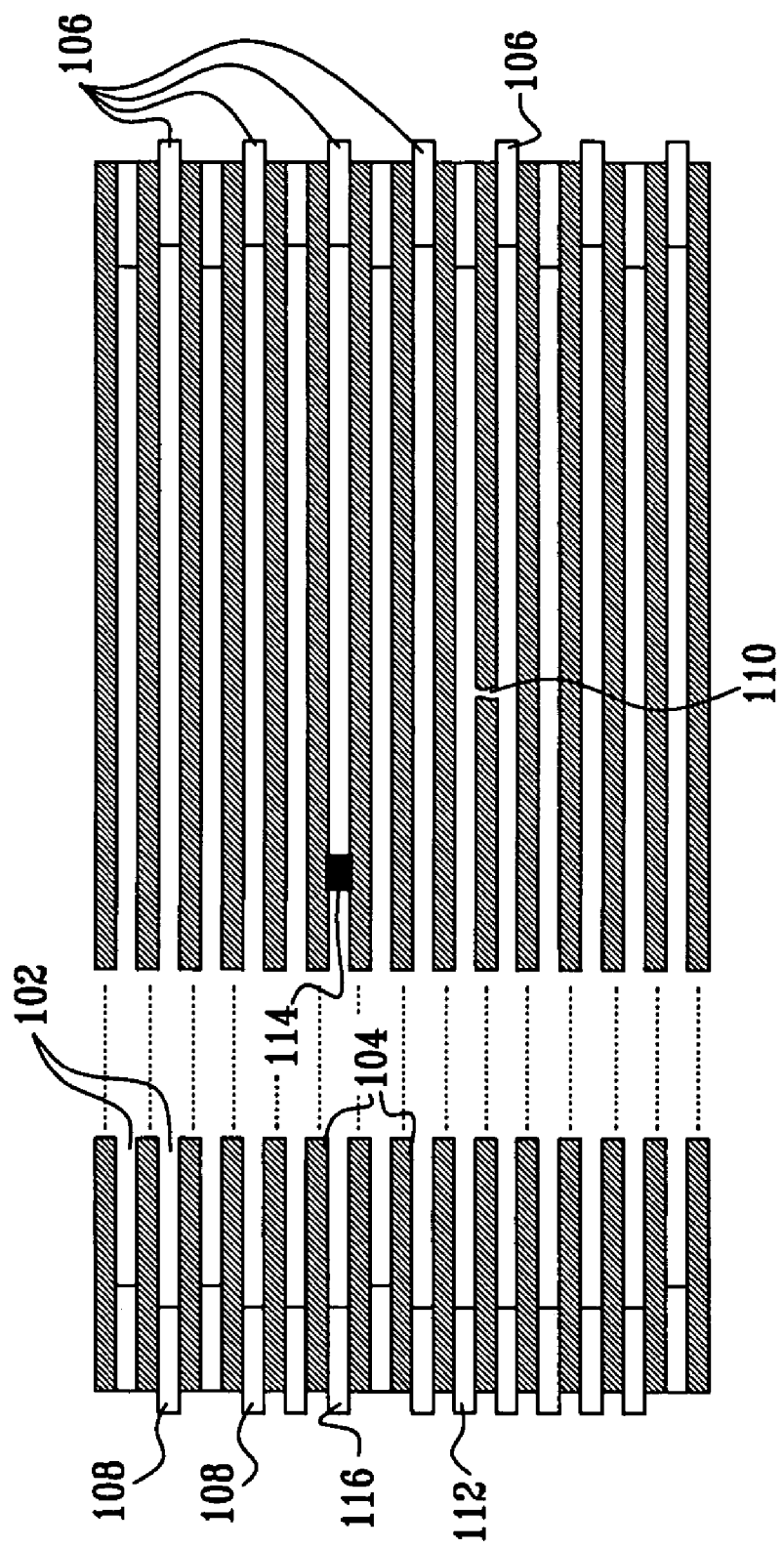
FIG. 6 is a schematic top view of a structure on a semiconductor wafer that is used in electrical testing of the wafer, in accordance with an embodiment of the present invention.

FIG. 6 is a schematic top view of a structure 100 on a semiconductor wafer. The structure is used in electrical testing of the wafer, in accordance with an embodiment of the present invention. Structure 100 may be identified as one of special structures 52 in the PDP data (FIG. 2), and may be provided specifically for the purpose of wafer testing, typically in one of non-die areas 46. Alternatively, the structure may have a functional purpose inside a die, for example, as a word line or data bus, which happens to be particularly amenable to a certain kind of testing.

In the example shown in FIG. 6, structure 100 comprises parallel conducting lines 102 on a substrate 104. Based on the PDP data, charging locations 106 are set at one end of lines 102, and measurement locations 108 are set at the opposite end. Charging locations 106 are charged, by a focused electron beam, for instance, and the charge on lines 102 is measured at measurement locations 106. The charge may be measured, for example, using a voltage contrast technique in a SEM, wherein the gray-scale level of structures in the SEM image indicates whether or not they are electrically charged. Alternatively, other charging and measurement techniques may be used.

Typically, not all of lines 102 are charged. Rather, in the present example, every other line is charged. The charge on the non-charged lines may also be measured at one or more alternative measurement locations 112. Normally, no charge should be measured at these alternative locations. In FIG. 6, however, there is a short circuit 110 between one of the charged lines and the adjacent uncharged line. A charge will therefore be detected at location 112, indicating that there is a defect in structure 100. On the other hand, a discontinuity 114 in one of lines 102 will result in an open circuit, so that a corresponding measurement location 116 will not exhibit the expected charge.

The method illustrated in FIG. 6 thus allows large areas of a die to be tested quickly without actually scanning the entire area. This electrical testing technique can detect the existence of any critical fault anywhere along the length of structure 100. Although FIG. 6 shows, by way of illustration, a particular, simple structure, the method exemplified by the figure may be used for testing all sorts of elongated conducting structures on the wafer.

Another type of electrical testing that can be facilitated by the methods of the present invention is specimen current measurement using an electron beam, for evaluating certain structures on the wafer, such as contact holes. The specimen current in an electron beam system is defined as the absorbed current that flows from the primary electron beam to ground via the wafer. It has been found that the specimen current is a good indicator of the etch quality of contact holes, as well as of other types of contact openings, such as vias and trenches. Exemplary methods of contact hole testing based on specimen current measurement are described, for example, in U.S. patent application Ser. No. 10/209,087, filed Jul. 30, 2002, and in U.S. patent application Ser. No. 10/434,977, filed May 9, 2003, which are assigned to the assignee of the present patent application and are incorporated herein by reference. In an embodiment of the present invention, a recipe for specimen current-based testing of a wafer is created automatically, by selecting measurement locations and other measurement parameters based on the known, three-dimensional wafer structure.

The data exchange between the EDA environment and the fab permits electrical tests to be built into the reticle design and then executed automatically in the fab based on the PDP data. For example, certain lines on a die may be connected to pads, which may then be accessed by an electrical tester. The pads may be placed in non-die areas, so that when the wafer is cut, the connections are isolated.

Yield Prediction Based on Design Information

Yield enhancement is a key objective of process monitoring in the fab. For purposes of yield enhancement, it is useful to be able to estimate the effect of certain process deviations on the actual IC yield of the overall process. Statistical methods have been developed for relating design and process parameters to the yield. For example, the above-mentioned article by Levasseur et al. a method for yield modeling based on combining the computation of critical areas (a measure of the susceptibility of a device to particle defects) with measurement of the actual defects detected by process inspection.

In some embodiments of the present invention, PDP data are used together with inspection results as statistical inputs in predicting and optimizing IC yield. As noted above, the PDP data may be used to identify critical sites on the die, at which process deviations may result in device failure. By appropriate selection of these sites, the measurements made by monitoring tools at these sites (for example, mean dimensions and standard deviation of critical structures at a number of locations) may be used in predicting the process yield. Such measurements may be made on a single die or, preferably, over multiple dies on one or more wafers. Additionally or alternatively, test structures for process characterization and yield prediction may be generated automatically from the PDP data, along with test parameters for evaluating production of the test structures.

CONCLUSION

Although the embodiments described above relate to certain specific implementation examples, the principles of the present invention may similarly be applied to automated generation of other sorts of process monitoring tests and evaluation of their results. Furthermore, PDP data may be used not only in monitoring, but also in automated selection of process tool recipes.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for monitoring fabrication of an integrated circuit (IC) on a semiconductor wafer, comprising: generating a product design profile (PDP) using an electronic design automation (EDA) tool, the PDP comprising an indication of a site in at least one layer of the IC that is susceptible to a process fault; fabricating the at least one layer of the IC on the wafer; and applying a process monitoring tool to perform a measurement at the site in the at least one layer responsively to the PDP.

2. The method according to claim 1, wherein applying the process monitoring tool comprises measuring a dimension associated with one or more features of the IC at the site.

3. The method according to claim 1, wherein generating the PDP comprises making a determination that the site is critical to a performance rating of the IC, and selecting the site responsively to the determination.

4. The method according to claim 1, wherein generating the PDP comprises making a determination that the site is marginal with respect to a design rule of the IC, and selecting the site responsively to the determination.

5. The method according to claim 1, wherein generating the PDP comprises making a determination that the site is marginal with respect to a variation in a parameter of a process used in fabricating the IC, and selecting the site responsively to the determination.

6. The method according to claim 1, wherein generating the PDP comprises determining a mask error enhancement factor (MEEF) at the site, and selecting the site responsively to the MEEF.

7. The method according to claim 1, wherein generating the PDP comprises determining an optical proximity correction (OPC) to be applied at the site, and selecting the site responsively to the OPC.

8. The method according to claim 1, wherein generating the PDP comprises determining a density of structures in the IC at the site, and selecting the site responsively to the density.

9. The method according to claim 1, wherein the site comprises a location of a pair of matched circuit elements, and wherein applying the process monitoring tool comprises verifying that a critical characteristic of both the circuit elements in the pair is substantially identical.

10. The method according to claim 1, and comprising predicting a yield of the fabrication of the IC responsively to the PDP and to the measurement.

11. A method for monitoring fabrication of an integrated circuit (IC) on a semiconductor wafer, comprising: generating a product design profile (PDP) using an electronic design automation (EDA) tool, the PDP comprising an identification of a region in at least one layer of the IC that is characterized by a periodic pattern; fabricating the at least one layer of the IC on the wafer; and applying a process monitoring tool to perform a measurement in the region of the at least one layer responsively to the periodic pattern.

12. The method according to claim 11, wherein generating the PDP comprises determining a pitch and a direction of the periodic pattern, and wherein applying the process monitoring tool comprises selecting a spatial filter responsively to the pitch and the direction, and performing optical inspection of the region using the spatial filter.

13. The method according to claim 11, wherein generating the PDP comprises determining a direction of the periodic pattern, and wherein applying the process monitoring tool comprises selecting a scan direction responsively to the direction of the periodic pattern, and inspecting the region while scanning over the region in the selected scan direction.

14. The method according to claim 11, wherein generating the PDP comprises determining an exact period of a repetitive feature in the periodic pattern, and wherein applying the process monitoring tool comprises capturing multiple images of the feature at locations on the wafer that are mutually spaced by the exact period, and comparing each of the images to another of the images or to a reference image.

15. The method according to claim 11, wherein applying the process monitoring tool comprises determining, responsively to the periodic pattern, a sensitivity setting to be applied by the process monitoring tool in detecting defects in the region, wherein different sensitivity settings are applied by the process monitoring tool in different regions of the at least one layer.

16. A method for monitoring fabrication of an integrated circuit (IC) on a semiconductor wafer, comprising: generating a product design profile (PDP) using an electronic design automation (EDA) tool, the PDP comprising an identification of a plurality of regions in at least one layer of the IC and a respective criticality parameter for each of the regions, indicative of a maximum tolerable defect size in each of the regions; fabricating at least one layer of the IC on the wafer; and applying a process monitoring tool to perform a measurement in one or more of the regions in at least one layer responsively to the respective criticality parameter.

17. The method according to claim 16, wherein applying the process monitoring tool comprises setting a defect detection threshold in each of the one or more of the regions responsively to the respective criticality parameter.

18. The method according to claim 16, wherein applying the process monitoring tool comprises selecting the one or more of the regions to inspect responsively to the respective criticality parameter.

19. The method according to claim 16, wherein applying the process monitoring tool comprises detecting a defect in one of the regions, and classifying the defect responsively to the criticality parameter.

20. A method for monitoring fabrication of an integrated circuit (IC) on a semiconductor wafer, comprising: designing a layout of at least one layer of the IC using an electronic design automation (EDA) tool, at least one layer comprising a structure that is amenable to testing; generating a product design profile (PDP) using the EDA tool, the PDP comprising information regarding the structure; fabricating at least one layer of the IC on the wafer; and applying a process monitoring tool to perform a measurement on the structure in at least one layer, responsively the information in the PDP.

21. The method according to claim 20, wherein the structure comprises a dedicated test structure.

22. The method according to claim 21, wherein the dedicated test structure is located in a non-die area of the wafer.

23. The method according to claim 20, wherein the structure comprises multiple elongate parallel conductors, and wherein applying the process monitoring tool comprises testing an electrical continuity of the conductors.

24. The method according to claim 23, wherein testing the electrical continuity comprises applying an electrical charge at a first end of at least some of the conductors, and measuring the electrical charge at a second end of the conductors.

25. The method according to claim 20, wherein the structure comprises one or more contact openings in at least one layer, and wherein applying the process monitoring tool comprises directing an electron beam to irradiate the one or more contact openings, and measuring a specimen current responsively to the electron beam.

* * * * *